United States Patent [19]
Marrocco, III

[11] Patent Number: 5,885,745
[45] Date of Patent: Mar. 23, 1999

[54] PHOTOIMAGEABLE COMPOSITIONS COMPRISING POLYQUINOLINE POLYMER AND PHOTOGENERABLE ACID PRECURSOR

[75] Inventor: Matthew L. Marrocco, III, Santa Ana, Calif.

[73] Assignee: Hitachi Chemical Co., Ltd., Tokyo, Japan

[21] Appl. No.: 845,902

[22] Filed: Apr. 28, 1997

[51] Int. Cl.[6] .................................................................. G03F 7/004

[52] U.S. Cl. .......................................................
430/270.1; 430/325; 430/326; 430/905; 430/926

[58] Field of Search ........................................
430/270.1, 430/325, 326, 905, 926

[56] References Cited

U.S. PATENT DOCUMENTS

| | | | |
|---|---|---|---|
| 5,306,789 | 4/1994 | Hay et al. | 525/471 |
| 5,489,623 | 2/1996 | Babb et al. | 522/151 |
| 5,585,217 | 12/1996 | Oba | 430/270.1 |
| 5,605,781 | 2/1997 | Gelorme et al. | 430/270.1 |

*Primary Examiner*—John S. Chu
*Attorney, Agent, or Firm*—Antonelli, Terry, Stout & Kraus, LLP

[57] ABSTRACT

Photoimageable polyquinoline compositions comprise a polyquinoline polymer, a photogenerable acid precursor and optionally a photosensitizer. The composition is prepared by dissolving the polyquinoline polymer, photogenerable acid precursor and photosensitizer in a polar solvent to form a solution, coating the solution onto a substrate and thereafter removing the solvent to form a film. The film is exposed to light through a photo mask and developed by immersion in a selective solvent to yield a photopatterned dielectric film.

32 Claims, 1 Drawing Sheet

PHOTOIMAGEABLE COMPOSITIONS COMPRISING POLYQUINOLINE POLYMER AND PHOTOGENERABLE ACID PRECURSOR

FIELD OF THE INVENTION

This invention relates to photoimageable compositions comprising a polyquinoline polymer or copolymer and a photogenerable acid precursor, and methods for photoimaging said compositions.

BACKGROUND OF THE INVENTION

Polymer dielectrics have a great deal of potential in the electronics industry. They are generally cheaper and easier to work with than the corresponding inorganic materials. In addition, newer ultra-high density, high-speed circuitry such as multichip modules (MCM) and chip-on-board (COB) printed circuit boards and new uses in liquid crystal displays (LCD's) require higher levels of performance than existing inorganic dielectrics can provide. There is also a desire to replace inorganic dielectrics with organic materials in integrated circuit (IC) applications because of the performance advantages that organic materials offer. While polymers have had little success in displacing established inorganics such as $SiO_2$ in the semiconductor industry, the potential performance and cost advantages that organic systems offer are driving IC manufacturers to consider them for future generations of semiconductor products. However, despite the potential that organic materials offer, their widespread usefulness has been hindered by the lack of appropriate organic materials with the right combination of properties for these applications.

Polymers are needed with thermooxidative and thermomechanical stability sufficient to withstand 300°–350° C. processing steps, moisture absorptions in the 0.1–1% regime, thermal expansion characteristics which match inorganic substrates (and therefore exhibit low residual stress), and dielectric constants below 3.0. Low dielectric constant materials are especially important for the construction of future signal processing devices which are projected to have clock speeds operating at frequencies within the GHz-range. The new dielectrics must form uniform, high-quality coatings, exhibit excellent resistance to dissolution and crazing by common processing solvents, and show good adhesion to inorganic and metallic substrates. An ideal material would also be easy to process (e.g., spin coat reproducibly, with a minimum of effort) and exhibit excellent long-term stability in solution. This highly demanding combination of properties is not currently available in any commercial product.

Polyimides are the current "state-of-the-art" organic dielectric coatings for microelectronic packaging. Although polyimides exhibit some of the aforementioned attributes, they are not an ideal class of polymers for electronic applications. Some of the drawbacks inherent in polyimides may be attributed to the highly polar carbonyl groups, four of which are present in the repeat unit of typical polyimides. These carbonyls are believed to be responsible for the tendency of polyimides to absorb water, generally at values between 1% and 2% of their weight. Water absorption has a significant deleterious effect on the electrical properties of polyimides, e.g., increased dielectric constant and dielectric loss. In addition, the polarizable nature of the carbonyls is responsible for the relatively high dielectric constants exhibits by polyimides, when compared to less polar polymers.

Another drawback to polyimides for electronic coating applications is that they are usually marketed in a prepolymer form, typically as a polyamic acid solution. These lacquers are applied by spin coating followed by thermal imidization. Polyamic acid solutions are inherently unstable and the viscosities of these solutions can change unless great care is taken during their storage and transport, making the goal of obtaining reproducible spun-on polyimide coatings more difficult. In addition, the imidization process involves the evolution of small molecules (usually water) and significant changes in the chemical structure of the polymers occur. Thus, the conversion of the prepolymer to the final polymer undoubtedly contributes to the high degrees of residual stress often observed at the interface between silicon substrates and polyimide coatings.

The achievement of very low dielectric constants coupled with low moisture uptake in thermally stable polymers suitable for use as organic dielectrics requires polymers that are less polar than polyimides. A particularly well-suited class of polymers for this purpose are polyquinolines. Polyquinolines were developed by John K. Stille, whose research group demonstrated the synthesis of dozens of polyquinoline derivatives.

The quinoline group itself has very high thermal stability. When combined with other thermally stable groups, examples of which include phenyl, phenylene, phenoxy, oxy, diphenylmethylene, hexafluoroisopropylidene, 9,9-fluorenylidene, dimethylsiloxy, diphenylsiloxy, methylphenylsiloxy, or thio, highly thermally stable polymers result. High thermal stability is useful for producing parts, films, fibers, and other objects which must withstand hot environments, including engine components, supersonic aircraft structures, and electronic components subjected to soldering temperatures or high temperature processing such as in integrated circuit manufacture.

Polyquinolines typically have excellent electrical properties, including low dielectric constants, and low moisture absorption. Polyquinolines are therefore useful as electrical insulators, or dielectrics as for example in printed wiring boards, multichip modules, integrated circuits, electrical connectors, capacitors, wire coating and the like. Polyquinolines having good thermal stability and excellent electrical and mechanical properties are disclosed in U.S. Pat. Nos. 4,000,187 and 5,017,677 to Stille and 5,247,050 to Hendricks and in J. K. Stille, *Macromolecules,* 1981, 14, 870, all of which are incorporated herein by reference.

For many electronics applications it is necessary to apply a layer of dielectric material in a specific pattern. Polyquinolines may be patterned by photolithography using techniques known for patterning other polymers, such as polyimides. The photolithographic process is capable of yielding very fine features, however, it is a complex process, and therefore costly. The total yield is the product of the yield of each individual step, so that fewer steps are always desired. Many steps in the photolithographic process can be eliminated if the material to be patterned is itself photosensitive, and a separate photoresist is not necessary. FIGS. 1 and 2 contrast the processing steps that are needed to wet etch non-photoimageable dielectrics with those needed to wet etch photoimageable dielectrics.

In FIG. 1 a substrate 1 is coated with a dielectric 3 in process 12. A photoresist 5 is coated on top of the dielectric 3 in process 14. The photoresist is exposed in process 18 by irradiating with light of a suitable frequency 11 through a mask 13. The resist is developed in process 20. The underlying dielectric 3 is etched in process 22. Finally the resist 5 is stripped in process 24 to give patterned dielectric 9. In many cases additional steps are needed. A barrier layer may be needed between the resist and dielectric layer adding a step to process 14. This barrier layer must be etched and stripped adding one step each to processes 20 and 24.

FIG. 2 shows the corresponding steps for a photoimageable dielectric. A substrate 10 is coated with a photoimageable dielectric 35 by process 30. The photoimageable dielectric 35 is exposed in process 32 by irradiating with light of suitable frequency 31 through a mask 36. The photoimageable dielectric 35 is developed in process 34 to give patterned dielectric 39.

As can be seen, photoimageable dielectrics greatly simplify the process of fabricating circuits in multichip module, integrated circuit, liquid crystal display, and other microelectronic applications. Accordingly, it would be desirable to provide a photoimageable polyquinoline containing dielectric composition which could be photopatterned without the extra steps required by non-photoimageable dielectrics.

SUMMARY OF THE INVENTION

The present invention provides a polyquinoline-containing dielectric composition which is photoimageable. The composition comprises a mixture of polyquinoline polymer and a photogenerable acid precursor (PGAP).

The amount of PGPA in the composition is from about 1 mol % to about 100 mol %, preferably from about 10 mol % to about 90 mol % and more preferably from about 20 mol % to about 80 mol % based on the molar concentration of quinoline repeat units. Preferred PGAPs include triarylsulfonium salts, diaryliodonium salts, nitrobenzylesters and benzylsulfones.

In a preferred embodiment, the composition further comprises a photosensitizer to increase the photospeed of the composition. The photosensitizer is present in an amount of from about 0.001% to about 20%, preferably from about 0.01% to about 10% and more preferably from about 0.17% to about 1% by weight of the polyquinoline.

The polyquinoline-containing photoimageable composition is prepared by dissolving the polyquinoline polymer, PGAP and optionally, the photosensitizer, in a solvent, typically a polar solvent. Preferred solvents include amide solvents, ester solvents, ketone solvents, phenol and alkylphenol solvents and formic acid. The polyquinoline polymer is preferably added to a concentration of about 0.1% to about 60% by weight, more preferably from about 1% to about 30% by weight and even more preferably from about 5% to about 25% by weight of the solution.

Once a uniform solution is achieved, the solution is coated onto a substrate by any suitable method. The solvent is thereafter removed by heating, vacuum or the like, to leave a photoimageable polyquinoline containing film.

The photoimageable film is thereafter patterned in a photolithographic process by first exposing the film to light in a specific pattern, e.g., through a photomask. The film and substrate are then immersed in a selective solvent, which dissolves either the exposed or unexposed areas of the film, but not both.

DETAILED DESCRIPTION OF THE INVENTION

Figure 1:
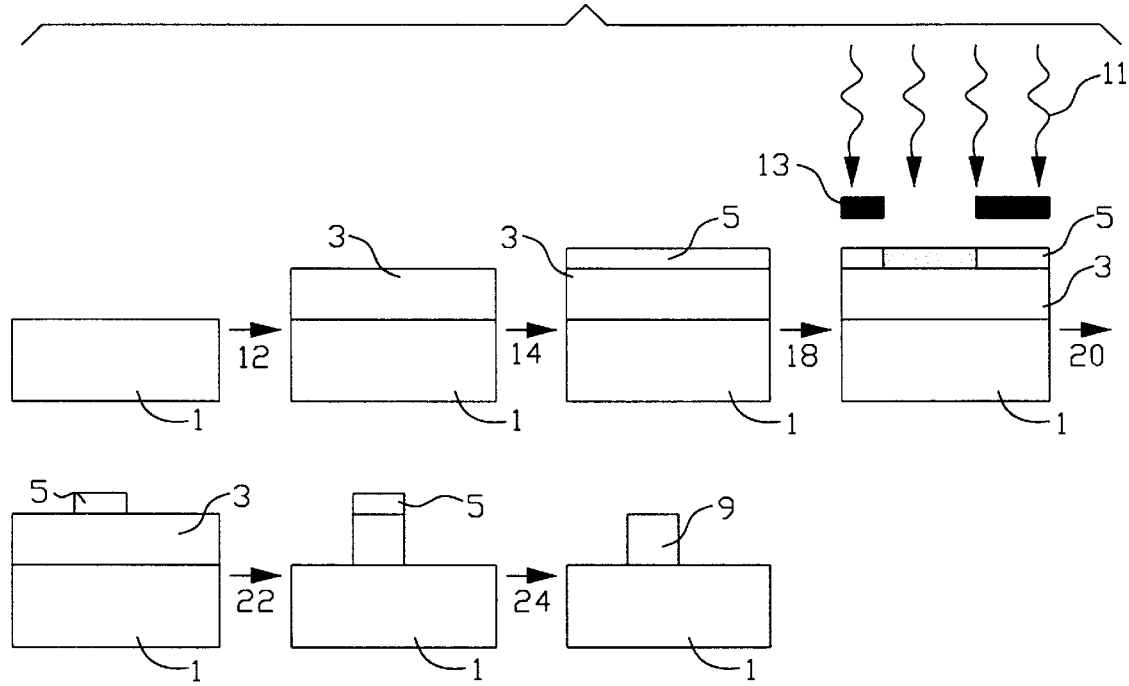
FIG. 1 is a diagram showing the principal process steps in a photolithographic process utilizing a non-photoimageable dielectric.
Figure 2:
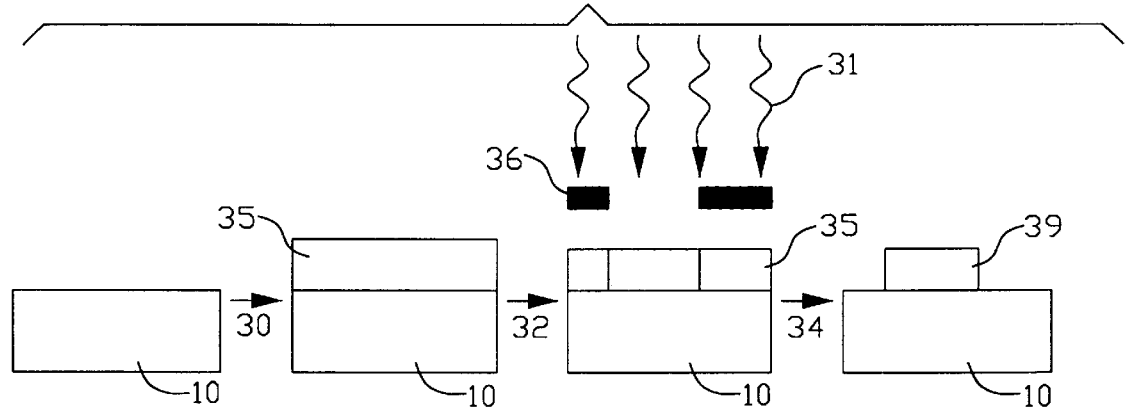
FIG. 2 is a diagram showing the principal process steps in a photolithographic process utilizing a photoimageable dielectric.

It has been found that polyquinoline compositions can be made photosensitive and photoimageable through the incorporation of photogenerable acid precursors (PGAP), and optionally a photo sensitizer.

To make a photoimageable polyquinoline composition, it is necessary to alter the polyquinoline polymer solubility by exposure to light. This approach takes advantage of the acid-base properties of polyquinolines, i.e., the quinoline group of a polyquinoline polymer is a weak base which can be protonated by strong acids.

Photogenerable acid precursors are compounds that are neutral, but which decompose to form a strong acid upon exposure to light energy at particular wavelengths or frequencies. Photosensitizers are compounds which absorb light at a different wavelength and thereafter transfer energy to the photogenerable acid precursor to cause it to form a strong acid.

It has been found that a mixture of a polyquinoline polymer and a photogenerated acid precursor form a negative photoresist. That is, a film comprising polyquinolines and PGAP, on exposure to light, becomes less soluble in certain solvents. When exposed to light through an appropriate photomask, and developed, a negative image of the photomask is produced in the polyquinoline/PGAP film.

Polyquinolines useful in the practice of the present invention may be any polymer having quinoline repeat units, such as those described in U.S. Pat. Nos. 4,000,187 or 5,247,050, both to Stille, 5,247,050 to Hendricks, and in J. K. Stille, *Macromolecules,* 1981, 14, 870–880 ("Stille article"), all of which are incorporated herein by reference.

U.S. Pat. No. 4,000,187 describes the preparation of polyquinoline homopolymers by the Friedlander condensation polymerization reaction of what are commonly referred to as "type AA" and "type BB" monomers. Type AA monomers are aromatic amino carbonyl monomers containing two sets of ortho-amino carbonyl functions attached to an aromatic nucleus. Particularly useful type AA monomers are selected from the group consisting of compounds represented by the formulas:

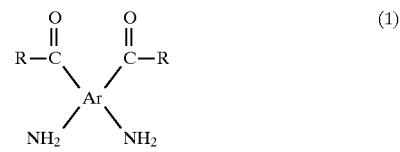

(1)

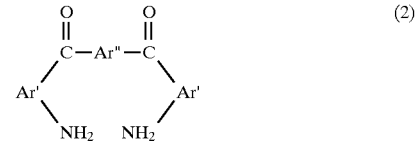

(2)

wherein R is hydrogen or a $C_6$ to $C_{12}$ aryl, including but not limited to phenyl, tolyl, naphthyl, and biphenyl, Ar is a tetravalent aromatic group in which the positions of attachment of each set of carbonyl and amino functions are ortho, Ar' is a divalent aromatic group in which the positions of attachment of the carbonyl and amino functions are ortho, Ar" is a divalent aromatic group. As described in U.S. Pat. No. 5,017,677, the Ar substituent of the general formulas (1) and (2) for the type AA compounds can be any aromatic nucleus in which the positions of attachment of each set of carbonyl and amino functions are ortho, including a single aromatic nucleus and a polycyclic aromatic nucleus.

The Ar substituent can be any tetravalent aromatic group in which the positions of attachment of each set of carbonyl and amino functions are ortho, including a single aromatic nucleus, a polycyclic aromatic nucleus and a polynuclear aromatic group. Examples of the Ar substituent include, but are not limited to, tetravalent aromatic groups of 6 to 26 carbon atoms, such as the following groups:

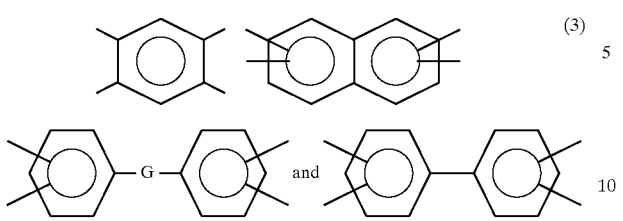
(3)

When the R substituent of the type AA compounds defined by the general formula (1) is aryl, Ar is most commonly tetravalent phenyl (ph).

The substituent Ar' is any divalent aromatic group in which the positions of attachment of the carbonyl and amino functions are ortho. Examples of the substituent Ar' include, but are not limited to, divalent aromatic groups of 6 to 12 carbon atoms, such as the following groups:

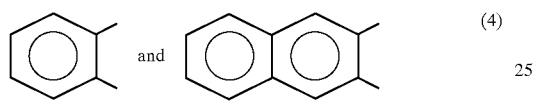
(4)

The substituent Ar" in the general formula (2) for the type AA compounds may be any divalent aromatic group, such as a divalent aromatic group of 5 to 26 carbon atoms, and one or more carbons on the aromatic nuclei may be substituted by other atoms, such as N. Examples of the Ar" substituent include, but are not limited to, the following groups:

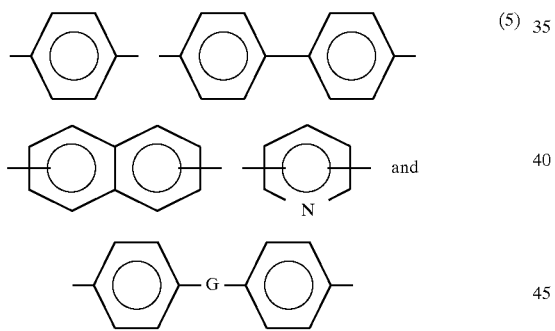
(5)

The symbol G represents a divalent group selected from the group consisting of an alkylene, such as an alkylene of 1 to 12 carbon atoms, an arylene, such as an arylene of 6 to 12 carbon atoms, an aralkylene, such as an aralkylene of 7 to 14 carbon atoms, an alkarylene, such as an alkarylene of 7 to 10 carbons, an alkylenedioxy, such as an alkylenedioxy of 1 to 12 carbon atoms, an arylenedioxy, such as an arylenedioxy of 6 to 12 carbon atoms, —O—, —CO—, —S—, —SO—, —SO$_2$—, a dialkylsilicon group, such as a dialkylsilicon of 1 to 5 carbon atoms per alkyl group, a diarylsilicon group, such as a diarylsilicon of 6 carbon atoms per aryl group, a divalent group having the following structure:

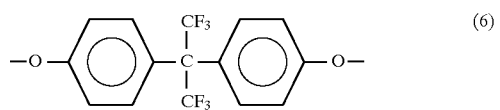
(6)

a divalent group having the following structure:

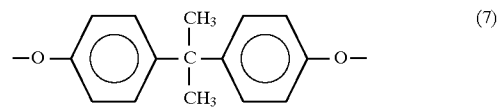
(7)

and a cardo group, such as the following groups:

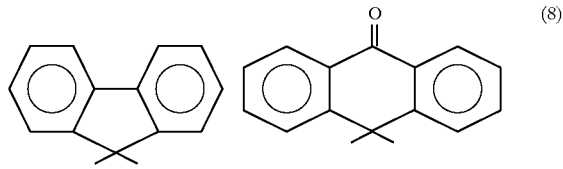
(8)

Type BB monomers are bis methylene ketone monomers selected from the group consisting of compounds represented by the formulas:

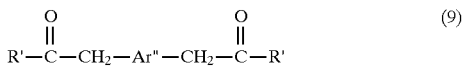
(9)

and

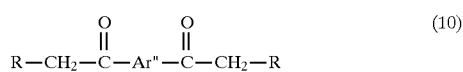
(10)

and

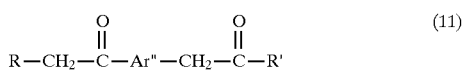
(11)

and

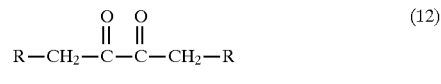
(12)

and

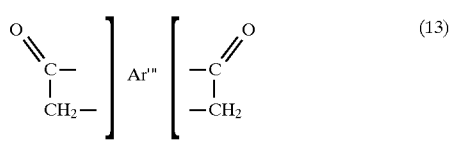
(13)

wherein R is as defined above, R' is a $C_6$ to $C_{12}$ aryl, including but not limited to phenyl, tolyl, naphthyl, and biphenyl, Ar" is a divalent aromatic group, and Ar'" is a tetravalent aromatic group, four positions of which are occupied by connection of the methylene carbonyl functions. The Ar" of the type BB compounds is the same as the Ar" of the type AA compounds. When the substituent R' or R of the type BB compounds is aryl, Ar" is most often phenylene.

The substituent Ar'" is a tetravalent aromatic group, such as a tetravalent aromatic group of 10 to 12 carbon atoms, and may be two divalent aromatic groups not already joined together or a single tetravalent group, e.g., a fused ring structure or bicyclic structure already joined some way. Examples of the Ar'" substituent include, but are not limited to, the following groups:

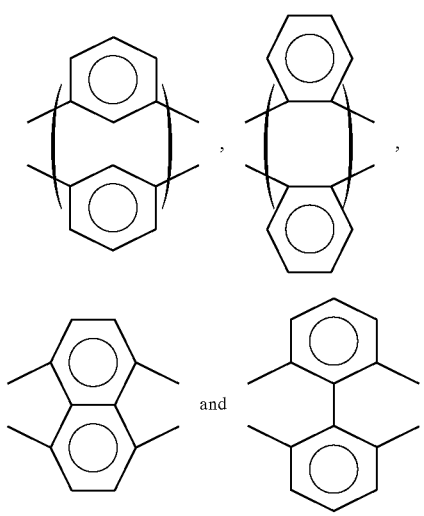

(14)

The Stille article reports that related polyquinoline polymers can be prepared from the reaction of monomers, referred to as "type AB" monomers, selected from the group consisting of aromatic compounds containing one set of ortho-amino carbonyl functions, as well as one methylene ketone function attached to an aromatic nucleus. Such monomers are represented by the formulas:

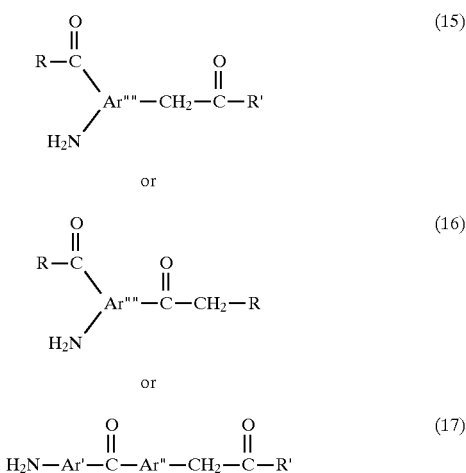

(15)

(16)

(17)

wherein R is hydrogen or an aryl, R' is an aryl, Ar' is a divalent aromatic group in which the positions of attachment of the carbonyl and amino functions are ortho, Ar" is a direct bond or a divalent aromatic group, and Ar"" is a trivalent aromatic group in which the positions of attachment of the set of carbonyl and amino functions is ortho.

The Ar' and Ar" of the type AB compounds are the same as the Ar' and Ar" described above with respect to type AA and BB compounds.

The substituent Ar"" is a trivalent aromatic group in which the positions of attachment of the set of carbonyl and amino functions is ortho. Examples of the substituent Ar"" include, but are not limited to, trivalent aromatic groups of 6 to 26 carbon atoms, such as the following groups:

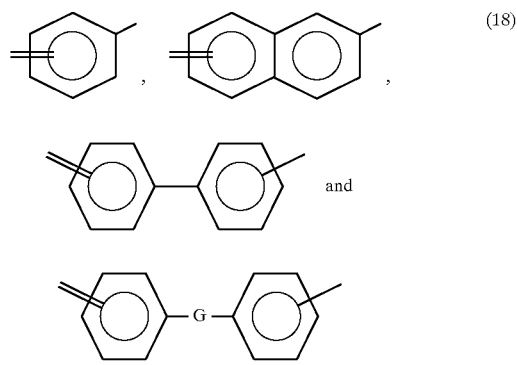

(18)

When the substituent R or R' of the AB compounds is aryl, Ar"" most often is a trivalent benzene group.

U.S. Pat. No. 5,017,677 describes the preparation of a polyquinoline copolymer composition which comprises the reaction product of various mixtures of type AA, type BB and type AB monomers.

U.S. Pat. No. 5,247,050 discloses fluorinated polyquinoline polymers in which the repeating units comprise one or more quinoline groups and at least a portion of the repeating units include a hexafluoroisopropylidene (6F) group or a 1-aryl-2,2,2-tri-fluoroethylidene (3F) group or both. Such polymers tend to be more soluble in common organic solvents, have lower dielectric constants, and lower moisture absorption yet maintain or exceed the thermal stability normally associated with prior art polyquinoline polymers.

One particularly preferred class of polyquinoline polymers, useful in the practice of the present invention, is shown below.

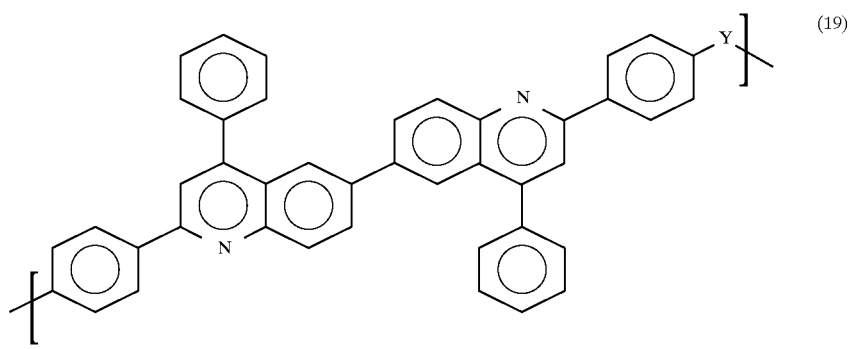

(19)

herein Y is a divalent radical taken from the group: nil, —O—, —N(H)—, —S—, carbonyl, i.e.,

 (20)

sulfone, i.e.,

 (21)

6F,

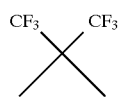 (22)

3F,

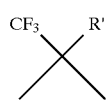 (23)

hexafluoroisopropylidene diphenoxy,

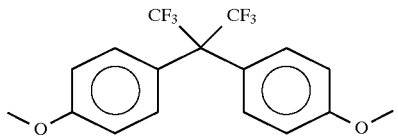 (24)

1-aryl-2,2,2-trifluoroethylidene diphenoxy,

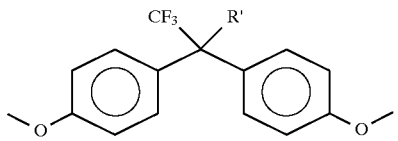 (25)

phenylene, and (26)

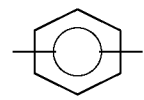

phenylenedioxy, (27)

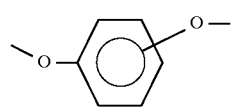

isopropylidene diphenoxy, aryl ethylidene and aryl ethylidene diphenoxy, wherein F in the above formulas can be substituted with H and wherein R' is as defined previously.

Other particularly preferred polyquinoline polymers useful in the practice of the present invention include:

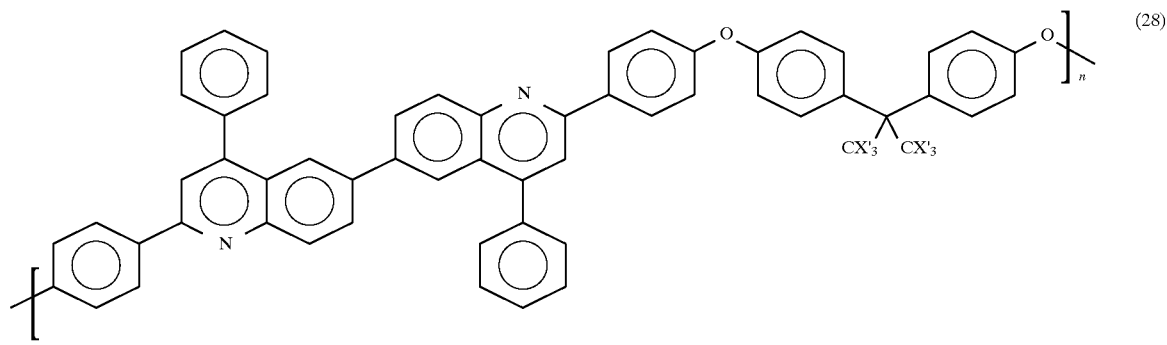 (28)

wherein X' is H or F, and

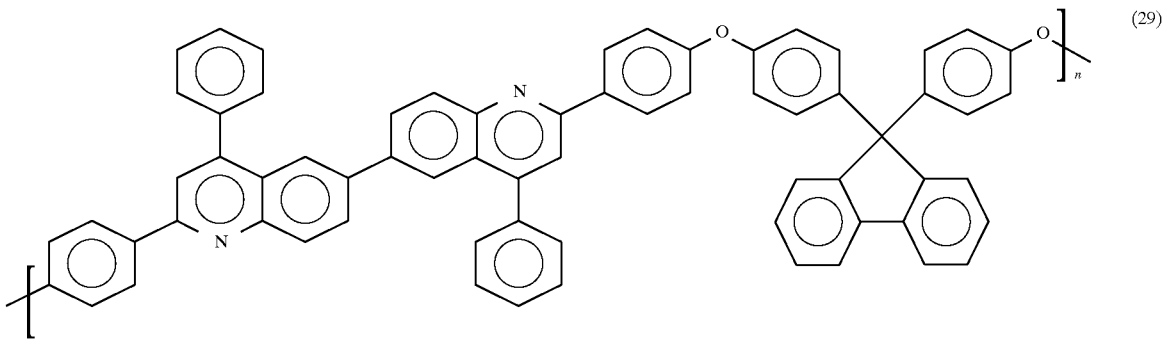

(29)

The number average molecular weight ($M_n$) of the polyquinoline polymers can be from about 1,000 to about 500,000, preferably from about 10,000 to about 100,000, more preferably from about 25,000 to about 75,000. The polyquinoline used in the examples herein has an $M_n$ of about 40,000.

The polyquinoline may be prepared by any method known in the art including, but not limited to, Friedlander condensation polymerization as described, for example, in U.S. Pat. Nos. 4,000,187 or 5,247,050, and nucleophilic polymerization as described in U.S. patent application Ser. No. 08/469993 filed Jun. 6, 1995, which is incorporated herein by reference.

In Friedlander condensation polymerization the monomers are mixed with a suitable acidic or basic catalyst and solvent and heated for a time and at a temperature sufficient to effect polymerization. The best catalysts were reported by Stille to be diarylphosphates, particularly di-meta-cresyl phosphate and diphenylphosphate and the best solvent was reported to be m-cresol. J. K. Stille, *Macromolecules*, 1981, 14, 870–880.

In an application entitled "Alkyl Phosphate Catalyst for Polyquinoline Synthesis" to M. Marrocco, filed concurrently herewith, the disclosure of which is incorporated herein by reference, there is described the use of alkyl phosphates, particularly dibutyl acid phosphate, as catalyst for the Friedlander condensation polymerization of monomers to form polyquinoline polymers.

As described in application Ser. No. 08/469,993, polyquinoline polymers can also be formed by nucleophilic polymerization. As described therein, polyquinoline polymers can be formed by providing a monomer having two fluoro groups, where each such fluoro group is activated by a quinoline nucleus, a diol monomer provided in the form of its bis-oxide salt, or in the presence of a base capable of deprotonating the diol and reacting the difluoro and diol monomers together in a dipolar solvent. Alternatively polyquinoline polymers can be formed by reacting a fluoro hydroxy monomer comprising a quinoline nucleus containing one activated fluoro group and one hydroxy group in the presence of a base and a dipolar solvent to form said polymer or by treating the monomer with a base to form an oxide salt and reacting the monomer salt in a dipolar solvent to form the polymer.

The PGAP compound may be any neutral or basic compound that reacts on exposure to light to form an acid. Examples of PGAPs useful in the practice of the present invention including, but not limited to, triarylsulfonium salts, diaryliodonium salts, nitrobenzyl esters, and benzylsulfones. Many photogenerated acids are known and commercially available.

Examples of triarylsulfonium salts useful in the practice of the present invention include, but are not limited to, triphenylsulfonium hexafluorophosphate, triphenylsulfonium hexafluoroantimonate, triphenylsulfonium hexafluoroarsenate, tritolylsulfonium hexafluorophosphate, triphenylsulfonium tetrafluoroborate, triphenylsulfonium tetraphenyl borate, triphenylsulfonium bromide, triphenylsulfonium tosylate, tritolylsulfonium iodide and compounds having the general formula

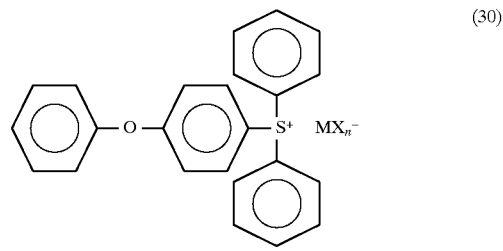

(30)

wherein $MX_n^-$ is an inert counter ion, where X is a halogen, preferably fluoride, and n is the number of halogen atoms and M is a metal or group III or V atom capable of forming a stable metal polyhalide anion. The valence of M is related to n by: n=valence plus 1. For example, if M is trivalent, n is four. Nonlimiting examples of M are B, Al, P, As, Sb, Ti, V, Nb, Zr and the like. Nonlimiting examples of $MX_n^-$ are tetrafluoroborate, hexafluorophosphate and hexafluoroantimonate.

Examples of diaryliodonium salts useful in the practice of the present invention includes, but are not limited to diphenyliodonium hexafluorophosphate, diphenyliodonium tetrafluoroborate, diphenyliodonium tetraphenyl borate, diphenyliodonium iodide, and diphenyliodonium 9,10-alkoxy anthracene sulfonate.

Examples of nitrobenzyl esters useful in the practice of the present invention include, but are not limited to, 2-nitrobenzyl tosylate, 2,6-dinitrobenzyl tosylate, 2,4-dinitrobenzyl tosylate, bis(2-nitrobenzyl)sulfate and compounds having the general formula

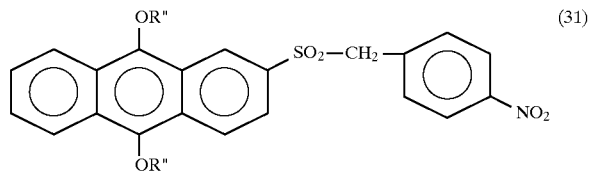

(31)

wherein R" is alkyl containing from 1 to about 20 carbon atoms, aryl containing from about 6 to about 20 carbon atoms, substituted alkyl or substituted aryl. Examples of alkyl are methyl, ethyl and hexyl. Examples of aryl include phenyl and naphthyl. Examples of substituents include halide, alkoxide, nitrile and amino. Additional examples of nitrobenzyl derivatives useful in the practice of the present invention are disclosed in U.S. Pat. No. 5,279,923 to Hiro, et al., which is incorporated herein by this reference.

Examples of benzylsulfones useful in the practice of the present invention include, but are not limited to, (2-methylbenzyl)phenyl sulfone, (2,4-dimethylbenzyl) phenyl sulfone, and bis-(2-methylbenzyl) sulfone.

Photosensitive polyquinoline films are prepared by dissolving both the polyquinoline and the PGAP in a common solvent. Polar solvents usually are required to dissolve the PGAP which are salts. Suitable solvents include amide solvents, ester solvents, ketone solvents, phenol and alkylated phenols, and formic acid. Examples of ketone solvents include cyclopentanone, cyclohexanone, acetone and methylethylketone. Examples of amide solvents include N,N-dimethylformamide, N,N-dimethylacetamide, N-methylpyrrolidinone, N-cyclohexylpyrrolidinone, tetramethylurea, and N-methylacetamide. Examples of ester solvents include ethyl acetate, ethyl lactate, propyleneglycol monomethylether acetate. Examples of useful alkylated phenols include meta-cresol, para-cresol, ortho-cresol, and individual and mixed isomers of dimethylphenol. Less polar solvents may be used for neutral PGAPs.

The polyquinoline concentration in the solution is preferably between about 0.1% and 60% by weight polyquinolines, more preferably between about 1% and 30% by weight polyquinolines, and most preferably between about 5% and 25% by weight polyquinolines. The molar amount of PGAP is from about 1 mol % to about 100 mol % based on the molar concentration of quinoline repeat units, preferably about 10 mol % to 90 mol %, and more preferably 20 mol % to 80 mol %.

The mixture is preferably stirred for a time and at a temperature sufficient to form a uniform solution of polyquinoline polymer and PAGP, preferably for about 1 to 2 hours at a suitable temperature, preferably from about 20° C. to about 100° C.

The solution of polyquinoline, PGAP and solvent is filtered if necessary and coated onto a substrate. Any method of coating may be used including spin coating, curtain coating, dip coating, spray coating, brush coating, roller coating and the like. Before coating, the viscosity may be adjusted, e.g., by partial solvent removal, for example, by evaporation due to heating and/or reduced pressure, until a viscosity suitable for the particular coating technique to be used is achieved. Nonlimiting examples of substrates are glass, quartz, diamond, silicon, silicon dioxide, tin (IV) oxide ($SnO_2$), aluminum nitride (AlN), alumina, plastics and polymers, metals including aluminum, copper, gold, nickel, titanium and the like and previously patterned layers.

The substrate may be treated using methods known in the art that use adhesion promoters or, where the film is to be removed, with release agents. Adhesion promoters, e.g., aminopropyltriethoxy silane, or other additions, such as dyes, fillers, and the like, may be added to the polymer solution before coating.

After coating, the solvent is removed, for example, by oven drying or drying under a vacuum or reduced pressure, the particular conditions, e.g. time, temperature, etc., used depending on the solvent employed, as is well known in the art. For example, typical drying temperatures are from about 40° C. to about 200° C., and preferably from about 50° C. to about 150° C. Drying times typically range from about one minute to about one hour depending on the temperature, drying apparatus and other conditions. Drying may take place at atmospheric pressure or at reduced pressure, as desired. The drying atmosphere may be air or an inert atmosphere such as nitrogen or argon. The film may be optionally removed from the substrate to form a freestanding film, or transferred from a temporary substrate, such as a polyethylene film substrate, to a second substrate. All handling of solutions, films, and intermediate products containing the polyquinolines/PGAP system should in the absence of light or under a safe-light which does not activate the PGAP.

The polyquinolines/PGAP film may then be patterned by exposure to radiation from a light source and development. In the processing of the photoimageable polyquinoline composition, the choice of light source is very important. Light energy must be absorbed by the PGAP to thereby form a strong acid which then reacts with the polyquinoline polymer to alter its solubility. Accordingly, light of a particular wavelength(s) must be used which will be absorbed by the PGAP (or photosensitizer if present). Further, the wavelength(s) used are preferably transparent, or nearly transparent to the polyquinoline polymer. Otherwise, it will only reach the top portion of the polyquinoline/PGAP film. In some instances, it may be desirable to expose only the upper portion of the film, e.g., to improve resolution by limiting the depth of field.

It is presently preferred that the light have a wavelength(s) in the range of from about 230 to about 600 nm and preferably from about 300 to about 500 nm. This is because most PGAPs absorb radiation in this range and most polyquinolines are at least partially transparent to light in this range. It is understood that the specific wavelength(s) selected, whether within the preferred range or not, will be optimized for the absorption properties of the particular polyquinoline polymer, PGAP and optionally photosensitizer in the composition. It is further understood that any light source, whether V, electron beam, X-ray, visible, infrared or the like, which produces light which is absorbed by the PGAP and effects a change in solubility in the polyquinoline polymer may be used.

The amount of light energy must be sufficient to induce a change in solubility of the polyquinoline/PGAP film to thereby enable it to act as a negative photoresist. It has been found that a four-watt light source providing from about 1 to about 5,000 $mJ/cm^2$ of light energy produces satisfactory results.

Typically the pattern is provided by a photomask. Alternative methods of patterning are exposing selected region with a scanned laser beam, projecting a focused image onto the film, or using the diffraction pattern of a mask to image the film.

The chemical reaction of a generic polyquinolines and a triarylsulfonium salt PGAP on exposure to light is believed to be as follows:

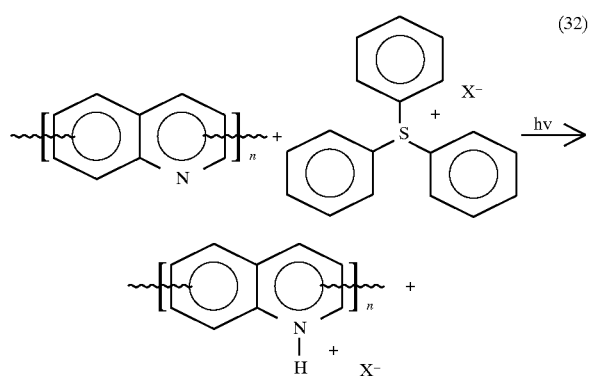

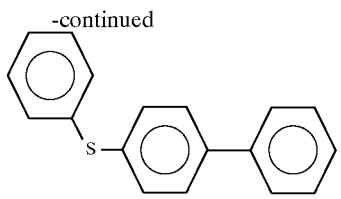

Following exposure the film is developed in a selective solvent. A selective solvent is a solvent in which either the exposed area is soluble or the unexposed area is soluble, but not both. On exposure the PGAP reacts to form a photogenerated acid (PGA). Since quinoline is a weak base the quinoline repeat units of the polyquinoline will be protonated by the PGA to form a quinolinium salt. As the polyquinoline becomes protonated, its solubility changes, i.e., it becomes less soluble in non-polar and weakly polar solvents and may become more soluble in strongly polar solvents. Non-polar and moderately polar solvents will therefore dissolve the unexposed areas selectively. Examples of selective non-polar or moderately polar solvents include aromatic solvents such as benzene, chlorobenzene, toluene, xylene, anisole, mesitylene, 1,2,4-trimethylbenzene and dioxane, ester solvents such as methyl acetate, ketone solvents such as acetone, cyclohexanone, cyclopentanone, and methylethylketone, amide solvents such as N,N-dimethylformamide, N,N-dimethylacetamide, N-methylpyrrolidone, N-cyclohexylpyrrolidone, tetramethylurea and N-methylacetamide, and the like.

Development may be accomplished by any suitable method as is well known in the art. For example, a dipping method may be used wherein the film is dipped and shaken in the developer. Alternatively, the film may be developed via a puddle method wherein the developer is heaped upon a substrate by using interfacial tension. Another alternative is to apply a spray or mist of the developer onto the film until development is complete. The maximum temperature of the developer depends on its boiling point or vapor pressure. Typically the developer is maintained at a temperature of room temperature to about 50° C. The amount of developer depends on the developing method used, the kind of developer used and the like.

The relative change in solubility depends in part on the initial polyquinoline solubility, the weight fraction of quinoline repeat units in the polyquinoline, the concentration of PGAP in the film, the exposure time and degree to which PGA has formed, the temperature, and the presence and amount of photo-sensitizers.

A simple procedure for choosing a selective solvent for a given polyquinoline/PGAP pair and selected light source consists of exposing sections of a film (on an inert substrate such as glass) of the polyquinolines/PGAP for 0, 20, 40, 60, and 80 min, then immersing the exposed film into a test solvent. For a negative photosystem the test solvent should be one which dissolves the unexposed film. The film is observed as it is lightly agitated. The unexposed areas should dissolve first with the areas of longest exposure dissolving last or remaining undissolved. If only the unexposed area dissolves then a set of shorter exposure times should be tried until the shortest time needed to render the exposed areas insoluble is found. Also if only the unexposed area dissolves it may be desirable to chose a more polar solvent, for example, if the more polar solvent offers advantages in volatility, or toxicity. If all areas dissolve then a less polar solvent should be tried. Rankings of solvents by polarity may be found for example in "The Chemist's Companion," A. J. Gordon, and R. A. Ford, John Wiley & Sons, NY, 1972, or organic chemistry textbooks. If nothing is known about the solubility of the polyquinoline then toluene may be used as the starting solvent.

Sensitizers may be added to the polyquinolines/PGAP to increase the photospeed, i.e., to decrease the amount of light needed to render the film insoluble. Many photosensitizers are commercially available. Examples of sensitizers useful in the practice of the present invention include, but are not limited to, phenothiazine, benzo[c]phenothiazine, benzophenone, 4,4'-bis(dimethylamino)benzophenone, xanthone, triphenylene, thioxanthone, anthraquinone, anthracene, 9,10-diphenylanthracene, 9,10-bis(phenylethynyl)anthracene, 2-methoxyanthracene, 1,5-dimethoxyanthracene, 1,8-dimethoxyanthracene, 6-chloroanthracene, 1,5-dichloroanthracene, 5,12-bis(phenylethynyl)naphthacene, chrysene, pyrene, 1,3-dicyanobenzene, phenyl-3-cyanobenzoate, 2-chlorothioxanthane, 2-methylthioxanthane, 2,4-diethylthioxanthane, 7-diethylamino-3-(2-thenoyl) coumarin, 3,3'-carbonyl bis(7-diethylamino coumarin), 7-diethyl amino-3-benzoyl coumarin, 3,3'-carbonyl bis(7-dimethoxy coumarin) and 7-H-benzo[c]phenothiazine.

The amount of sensitizer may be determined by test exposures, measuring the time required under a particular light source to render the polyquinolines/PGAP film insoluble at a series of photosensitizer concentrations. The amount of sensitizer is preferably about 0.001% to 20% of the weight of the polyquinolines, more preferably about 0.01% to 10%, and most preferably about 0.1% to 1%.

Because the PGAP and the photosensitizer are typically relatively high priced materials it is usually desirable to keep their concentration to a minimum. Using the tests outlined above one skilled in the art will be able to formulate an optimum amount of PGAP and photosensitizer. In addition, one may wish to alter the polyquinolines, for example, by lowering the molecular weight (MW), which measures solubility, of both exposed and unexposed areas. Lowering the MW can be achieved by endcapping or terminating the polymerization after a short time.

Each photosensitizer absorbs light energy in particular frequency ranges, and is therefore effective for different frequencies of light. For example, benzo[c]phenothiazine (BPT) functions as a sensitizer to light between 400 and 430 nm (M. Barra, R. W. Redmond, M. T. Allen, G. S. Calabrese, R. Sinta, and J. C. Scaiano, *Macromolecules* 1991, 24, 4972). The polyquinoline polymer of Example 2 below is transparent to 420 nm light, and thus BPT is expected to work well in this system. Excellent images are obtained when a small amount ($\leq 0.2$ wt %) of BPT is incorporated into a blend of MBPS and the polyquinoline of Example 2 and the film is exposed at 420 nm.

It may be desirable to remove the PGA and/or the PGAP from the patterned polyquinoline film. This requires washing in a solvent which does not dissolve the developed polyquinoline, but does dissolve the PGA and/or the PGAP. The PGA and PGAP are typically ionic compounds and will dissolve in very polar solvents, whereas the polyquinolines do not dissolve in very polar solvent such as ethanol, acetone, and water. The PGA is also acidic and may be neutralized with base to form a salt which will be soluble in very polar solvents. Since the quinoline repeat unit is a weak base, it is desirable to add a soluble base to the wash solvent to displace the PGA from the quinoline repeat units. The developed polyquinoline films may be washed in very polar solvent including but not limited to ethanol, acetone, and water; optionally including soluble bases including but not limited to quinoline, pyridine, triethanolamine, triethylamine, ammonium hydroxide, alkali and alkali earth hydroxides, carbonates, and bicarbonates, to remove the PGA and PGAP before further processing.

The polyquinolines/PGAP film maybe subjected to baking steps before or after exposure to light, and before or after development. Baking steps can increase sensitivity and resolution. Typical baking steps are heating the film coated substrate to 100° C. for 15 min., or heating to 150° C. for 5 min, or more elaborate heating protocols, holding at more than one temperature, or with controlled rates of heating may be used.

perature was raised to 170° C., and the mixture was filtered hot through Celite. The mother liquor was cooled to −20° C. and the product was collected by filtration. The yellow solid was washed with cold ethanol/methylene chloride (3/1) and was dried in a vacuum oven at 100° C.

EXAMPLE 2

Preparation of a polyquinoline of the structure

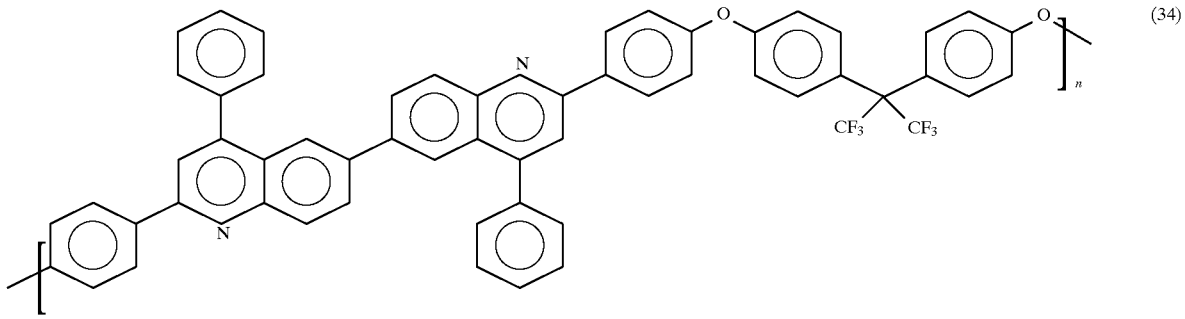

The following examples are illustrative of the present invention.

EXAMPLE 1

Preparation of difluoroquinoline monomer bis-6,6'-[2-(4-fluorophenyl)-4-phenylquinoline]

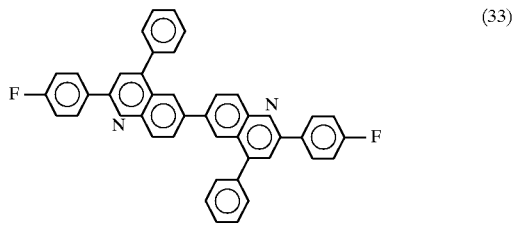

A three-necked, 2 L round-bottomed flask equipped with a thermometer, a mechanical stirrer, and a distillation unit fitted with a nitrogen inlet valve was charged with 2-amino-5-chlorobenzophenone (695.0 g, 3.00 mol), 4'-fluoroacetophenone (456.0 g, 3.30 mol), and p-tosic acid (47.62 g, 0.25 mol). The reaction mixture was heated under nitrogen at 165° C. (44 h). The yellow 4'-acetophenone that co-distilled with the water was separated and reintroduced to the reaction mixture through the heating period. The mixture was further heated to 190° C. (2 h). The mixture was cooled to 120° C. and poured into 95% ethanol (10 L) while vigorously stirring with a mechanical stirring rod setup. The mixture was filtered and the precipitate washed with ethanol (1 L). The solid, 6-chloro-2-(4-fluorophenyl)-4-phenylquinoline was dried in a vacuum oven at 80° C. (16 h).

A 250 mL, three necked, round-bottomed flask fitted with a stirring rod set up and a nitrogen inlet was charged with the solid 6-chloro-2-(4-fluorophenyl)-4-phenylquinoline (25.0 g, 75 mmol), bis(triphenyl-phosphine) nickel dichloride (0.681 g, 1.04 mmol), sodium iodide (1.40 g, 9.37 mmol), triphenylphosphine (8.19 g, 33.3 mmol), and activated zinc dust (3.13 g, 47.9 mmol) and NMP (N-methylpyrrolidinone) (86 mL). The flask was heated under nitrogen to 70° C. (16 h). The mixture was diluted with NMP (10 mL), the tem- An oven-dried, three-necked, 100 mL round-bottomed flask equipped with a mechanical stirrer, a Dean-Stark trap, and a nitrogen inlet was charged with the difluoro quinoline monomer of Example 1 (2.98 g, 5.0 mmol), hexafluoroisopropylidenebisphenol (bis-phenol AF) (1.68 g, 5.0 mmol), potassium carbonate (1.04 g, 7.5 mmol), anhydrous NMP (20 mL), and toluene (20 mL). The mixture was heated to reflux (ca. 135° C.) under nitrogen (16 h). The toluene was removed, the Dean-Stark trap was replaced by a condenser, and the mixture was again heated at reflux (24 h). The reaction mixture was diluted with NMP (30 mL) and allowed to cool to room temperature. The polymer was precipitated by slowly pouring the solution into distilled water (250 mL). The solid was collected by filtration and dried under vacuum at 130° C. (yield >95%). $M_n$=70,000 by GPC relative to polystyrene standards.

The polyquinoline polymer has a $T_g$ of about 265° C. and is soluble in amide solvents, such as NMP, DMAC, and the like, and in some ether and ester solvents, including cyclopentanone and tetrahydrofuran. The polyquinoline polymer is insoluble in toluene, hexane, diethylether, water, acetone, and alcohols. Heating the polyquinoline polymer to elevated temperatures of about 300° C. for about 1 to 10 hours increases the $T_g$ to about 280° C. and decreases the solubility.

EXAMPLE 3

Polyquinoline Diphenyliodonium Salt Photoimageable Polyquinoline

The polyquinoline of Example 2 was dissolved in cyclopentanone to make a 5% by weight solution. To this solution was added enough diphenyliodonium hexafluorophosphate to make the solution 0.1% by weight diphenyliodonium hexafluorophosphate. The diphenyliodonium hexafluorophosphate did not completely dissolve, but remained a fine suspension. A glass microscope slide was dip coated in the polyquinolines\PGAP solution and dried in a convection oven at 80° C. for 1 hour. The plate was partially masked and exposed to a four-watt 254 nm UV light for 6 hours. The exposed plate was developed by immersion in lightly agitated toluene. After approximately 2 minutes a weak pattern of the negative image of the mask developed.

EXAMPLE 4

Polyquinoline Diphenyliodonium Salt Photoimageable Polyquinoline

Example 3 was repeated except that the polyquinolines/PGAP solution was made 0.5% by weight diphenyliodonium hexafluorophosphate. After developing in toluene a clear negative pattern of the mask developed.

EXAMPLE 5

Polyquinoline MBPS Photoimageable Polyquinoline

The polyquinoline polymer of Example 2 was dissolved in cyclopentanone to make a 5% by weight solution. To four separate samples of this solution (2-methylbenzyl)phenylsulfone (MBPS) was added to make the following solutions:

| Soluble | % Polyquinolines | % MBPS |
|---------|------------------|--------|
| A       | 5                | L      |
| B       | 5                | 2      |
| C       | 5                | 3      |
| D       | 5                | 4      |

Glass slides were dip-coated into solutions A, B, C or D and dried at 80° C. for 1 hour in a convection oven. The slides were partially masked and exposed to a four-watt 254 nm UV light for 4 hours and developed with toluene for about 2 minutes. Patterns matching negative images of the mask were seen in all four samples.

EXAMPLE 6

Polyquinoline MBPS/BPT Photoimageable Polyquinoline

Solutions of the polyquinoline polymer of Example 2, (2-methylbenzyl)phenylsulfone (MBPS), and 7-H-benzo[c]phenothiazine (BPT), were made in cyclopentanone having the following concentrations:

| Soluble | % Polyquinolines | % MBPS | % BPT |
|---------|------------------|--------|-------|
| E       | 5                | 1      | −0.1  |
| F       | 5                | 1      | 0.2   |

Glass slides were dip-coated into solutions E or F and dried at 80° C. for 1 hour in a convection oven. The slides were partially masked and exposed to a four-watt 420 nm UV light for 2 hours. After developing in toluene both samples showed clear patterns representing negative images of the mask.

What is claimed is:

1. A photoimageable composition comprising a polyquinoline polymer and a photogenerable acid precursor, wherein the polyguinoline polymer has repeating units having the structure

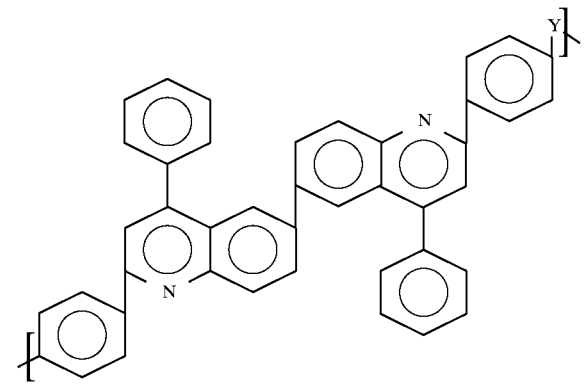

wherein Y is a divalent radical selected from the group consisting of from nil, —O—, —N(H)—, —S—, carbonyl, sulfone, hexafluoroisopropylidene, 1-aryl-2,2,2-trifluoroethylidene, hexafluoroisopropylidene diphenoxy, 1-aryl-2,2,2-trifluoroethylidene diphenoxy, isopropylidene, isopropylidene diphenoxy, phenylene, phenylenedioxy, aryl ethylidene, and aryl ethylidene diphenoxy, and wherein F may be substituted with H.

2. The composition of claim 1 wherein the amount of photogenerable acid precursor is from about 1 mol % to about 100 mol % based on the molar concentration of quinoline repeat units in the polyquinoline polymer.

3. The composition of claim 1 wherein the amount of photogenerable acid precursor is from about 10 mol % to about 90 mol % based on the molar concentration of quinoline repeat units in the polyquinoline polymer.

4. The composition of claim 1 wherein the amount of photogenerable acid precursor is from about 20 mol % to about 80 mol % based on the molar concentration of quinoline repeat units in the polyquinoline polymer.

5. The composition of claim 1 wherein the photogenerable acid precursor is selected from the group consisting of triarylsulfonium salts, diaryliodonium salts, nitrobenzyl esters, benzylsulfones and mixtures thereof.

6. The composition of claim 1 wherein the photogenerable acid precursor is triarylsulfonium hexafluorophosphate.

7. The composition of claim 1 wherein the photogenerable acid precursor is triphenylsulfonium hexafluorophosphate.

8. The composition of claim 1 wherein the photogenerable acid precursor is (2-methylbenzyl)phenylsulfone.

9. The composition of claim 1 where the polyquinoline polymer has repeat units having the structure

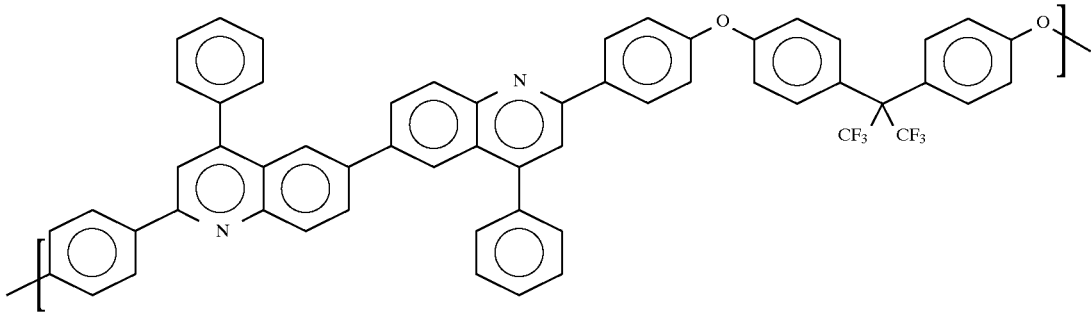

10. The composition of claim 1 where the polyquinoline polymer has repeat units having the structure

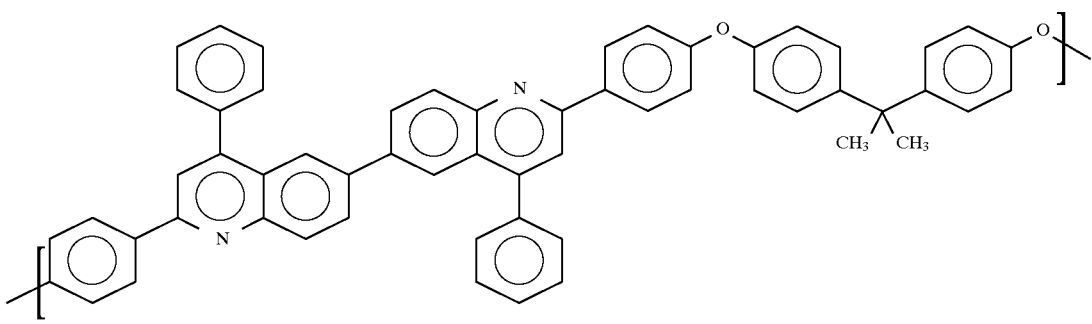

11. The composition of claim 1 further comprising a photosensitizer.

12. The composition of claim 11 wherein the photosensitizer is present in an amount of from about 0.001% to about 20% by weight of the polyquinoline.

13. The composition of claim 11 wherein the photosensitizer is present in an amount of from about 0.01% to about 10% by weight of the polyquinoline.

14. The composition of claim 11 wherein the photosensitizer is present in an amount of from about 0.1% to about 1% by weight of the polyquinoline.

15. The composition of claim 11 wherein the photosensitizer is selected from the group consisting of phenothiazine, benzo[c]phenothiazine, benzophenone, 4,4'-bis(dimethylamino)benzophenone, xanthone, triphenylene, thioxanthone, anthraquinone, anthracene, 9,10-diphenylanthracene, 9,10-bis(phenylethynyl)anthracene, 2-methoxyanthracene, 1,5-dimethoxyanthracene, 1,8-dimethoxyanthracene, 6-chloroanthracene, 1,5-dichloroanthracene, 5,12-bis(phenylethynyl)naphthacene, chrysene, pyrene, 1,3-dicyanobenzene, phenyl-3-cyanobenzoate, 2-chlorothioxanthane, 2-methylthioxanthane, 2,4-diethylthioxanthane, 7-diethylamino-3-(2-thenoyl) coumarin, 3,3'-carbonyl bis(7-diethylamino coumarin), 7-diethyl amino-3-benzoyl coumarin, 3,3'-carbonyl bis(7-dimethoxy coumarin) and 7-H-benzo[c]phenothiazine.

16. A method for preparing a photoimageable polyquinoline film comprising:
dissolving a polyquinoline polymer and a photogenerable acid precursor in a solvent to form solution;
apply a coating of the solution to a substrate; and
removing the solvent from the coated solution to thereby form a photoimageable film,
wherein the polyquinoline polymer has repeating units having the structure

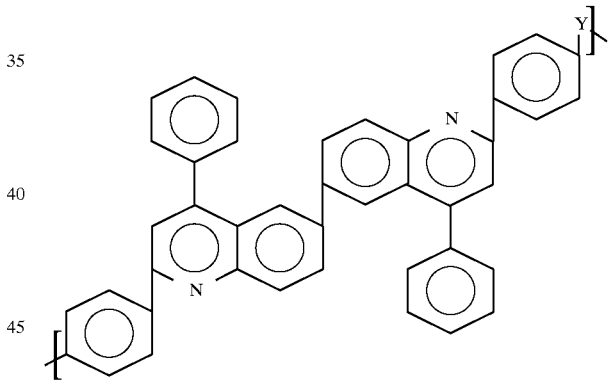

wherein Y is a divalent radical selected from the group consisting of from nil, —O—, —N(H)—, —S—, carbonyl, sulfone, hexafluoroisopropylidene, 1-aryl-2,2,2-trifluoroethylidene, hexafluoroisopropylidene diphenoxy, 1-aryl-2,2,2-trifluoroethylidene diphenoxy, isopropylidene, isopropylidene diphenoxy, phenylene, phenylenedioxy, aryl ethylidene, and aryl ethylidene diphenoxy, and wherein F may be substituted with H.

17. The method of claim 16 wherein the concentration of polyquinoline polymer in the solution is from about 0.1% to about 60% by weight of the solution.

18. The method of claim 16 wherein the concentration of polyquinoline polymer in the solution is from about 1% to about 30% by weight of the solution.

19. The method of claim 16 wherein the concentration of polyquinoline polymer in the solution is from about 5% to about 25% by weight of the solution.

20. The method of claim 16 wherein the solvent is a polar solvent selected from the group consisting of amide solvents, ester solvents, ketone solvents, phenol solvents, alkylphenol solvents and formic acid.

21. The method of claim 16 wherein the amount of photogenerable acid precursor is from about 1 mol % to about 100 mol % based on the molar concentration of quinoline repeat units in the polyquinoline polymer.

22. The method of claim 16 wherein the amount of photogenerable acid precursor is from about 10 mol % to about 90 mol % based on the molar concentration of quinoline repeat units in the polyquinoline polymer.

23. The method of claim 16 wherein the amount of photogenerable acid precursor is from about 20 mol % to about 80 mol % based on the molar concentration of quinoline repeat units in the polyquinoline polymer.

24. The method of claim 16 further comprising dissolving a photosensitizer in the solvent.

25. A method for forming a photo-patterned polyquinoline-containing dielectric film comprising:

dissolving a polyquinoline polymer and a photogenerable acid precursor in a solvent to form solution;

applying a coating of the solution to a substrate;

removing the solvent from the coated solution to thereby form a photoimageable film;

exposing selected areas of the film with light; and developing the exposed film by immersion in a selective solvent which dissolves one of the exposed areas of the film or unexposed areas of the film, wherein the polyguinoline polymer has repeating units having the structure

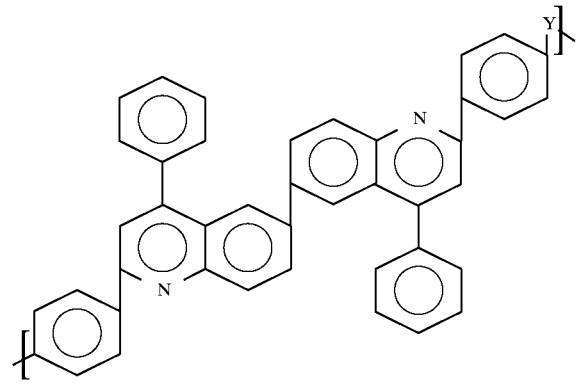

wherein Y is a divalent radical selected from the group consisting of from nil, —O—, —N(H)—, —S—, carbonyl, sulfone, hexafluoroisopropylidene, 1-aryl-2,2,2-trifluoroethylidene, hexafluoroisopropylidene diphenoxy, 1-aryl-2,2,2-trifluoroethylidene diphenoxy, isopropylidene, isopropylidene diphenoxy, phenylene, phenylenedioxy, aryl ethylidene, and aryl ethylidene diphenoxy, and wherein F may be substituted with H.

26. The method of claim 25 wherein the selective solvent dissolves unexposed areas of the film.

27. The method of claim 26 wherein the selective solvent is selected from the group consisting of anisole, benzene, chlorobenzene, toluene, xylene, mesitylene, 1,2,4-trimethylbenzene, dioxane, methyl acetate, acetone and mixtures thereof.

28. The method of claim 26 wherein the selective solvent comprises toluene.

29. The method of claim 26 wherein the selective solvent comprises an alkylketone.

30. The method of claim 26 wherein the selective solvent comprises an alkyl amide.

31. The method of claim 25 wherein the wavelength of light is between 230 and 600 nm.

32. The method of claim 25 wherein the wavelength of light is between 300 and 500 nm.

* * * * *